United States Patent
Wada et al.

(10) Patent No.: US 12,104,260 B2
(45) Date of Patent: Oct. 1, 2024

(54) METHOD FOR PRODUCING SEMICONDUCTOR ELEMENT AND CHEMICAL SOLUTION TO BE USED IN METHOD FOR PRODUCING SEMICONDUCTOR ELEMENT

(71) Applicant: TOKYO OHKA KOGYO CO., LTD., Kawasaki (JP)

(72) Inventors: Yukihisa Wada, Kawasaki (JP); Kazuhiro Takahashi, Kawasaki (JP)

(73) Assignee: TOKYO OHKA KOGYO CO., LTD., Kawasaki (JP)

( * ) Notice: Subject to any disclaimer, the term of this patent is extended or adjusted under 35 U.S.C. 154(b) by 171 days.

(21) Appl. No.: 17/644,248

(22) Filed: Dec. 14, 2021

(65) Prior Publication Data

US 2022/0205111 A1 Jun. 30, 2022

(30) Foreign Application Priority Data

Dec. 28, 2020 (JP) ................................ 2020-218757

(51) Int. Cl.
*C23F 1/00* (2006.01)
*C23F 1/30* (2006.01)
*H01L 21/311* (2006.01)

(52) U.S. Cl.
CPC .......... *C23F 1/30* (2013.01); *H01L 21/31116* (2013.01)

(58) Field of Classification Search
CPC ........ C23F 1/30; C23F 1/40; H01L 21/31116; H01L 21/3212
See application file for complete search history.

(56) References Cited

U.S. PATENT DOCUMENTS

| | | | |
|---|---|---|---|
| 8,211,800 B2 * | 7/2012 | Uozumi | H01L 21/02074 |
| | | | 438/653 |
| 2009/0130849 A1 * | 5/2009 | Lee | H01L 21/02063 |
| | | | 438/693 |
| 2017/0222138 A1 | 8/2017 | Park et al. | |
| 2019/0103363 A1 * | 4/2019 | Yu | H01L 21/32136 |
| 2020/0165547 A1 * | 5/2020 | Takahashi | H01L 21/02052 |
| 2020/0190672 A1 | 6/2020 | Ohhashi et al. | |
| 2020/0354632 A1 * | 11/2020 | Sugimura | H01L 21/02087 |
| 2022/0002622 A1 | 1/2022 | Takahasi et al. | |

FOREIGN PATENT DOCUMENTS

| | | |
|---|---|---|
| JP | 2018-121086 A | 8/2018 |
| JP | 2020-097765 A | 6/2020 |
| WO | WO 2016/068183 A1 | 5/2016 |
| WO | WO 2020/195628 A1 | 10/2020 |

OTHER PUBLICATIONS

Wikipedia, "Ammonia solution" via http://web.archive.org/web/20190407030119/https://en.wikipedia.org/wiki/Ammonia_solution ; pp. 1-5 (Year: 2019).*

* cited by examiner

*Primary Examiner* — Binh X Tran

(74) *Attorney, Agent, or Firm* — Knobbe, Martens, Olson & Bear, LLP

(57) ABSTRACT

A method for producing a semiconductor element and a chemical solution to be used in the method for producing a semiconductor element, the method including dry-etching or chemically-mechanically polishing a ruthenium-containing layer located as an uppermost layer of a substrate; and bringing a surface of the substrate into contact with a chemical solution thereby satisfactorily cleaning and removing a ruthenium residue formed on the surface of the substrate; and a chemical solution to be suitably used in the method for producing a semiconductor element.

5 Claims, No Drawings

METHOD FOR PRODUCING SEMICONDUCTOR ELEMENT AND CHEMICAL SOLUTION TO BE USED IN METHOD FOR PRODUCING SEMICONDUCTOR ELEMENT

RELATED APPLICATION

This application claims priority to Japanese Patent Application No. 2020-218757, filed Dec. 28, 2020, the entire content of which is incorporated herein by reference.

BACKGROUND OF THE INVENTION

Field of the Invention

The present invention relates to a method for producing a semiconductor element and a chemical solution to be used in the method for producing a semiconductor element.

Related Art

Recently, with the miniaturization of semiconductor devices, there has been a demand to form metal wiring having a metal pitch of 20 nm or less. In this case, a conventional dual damascene structure using copper as a metal wiring material in a back end of line (BEOL) step had problems such as patterning variation and a resistance increase almost up to the limit. Therefore, there has been proposed a semi-damascene structure using low-resistant metal ruthenium.

For formation of the semi-damascene structure, a ruthenium layer formed on a surface layer of a substrate is dry-etched. When the ruthenium layer is dry-etched, a reaction product of ruthenium and an etching gas (hereinafter may be referred to simply as "ruthenium residue") may be formed on a surface of the ruthenium layer or other surface-exposed films. Therefore, there has been desired a chemical solution capable of cleaning and removing the ruthenium residue formed during the dry etching. Furthermore, for a contact wiring using tungsten or cobalt as a metal wiring material in a middle end of line (MOL) step, there has been proposed low-resistant ruthenium having a resistance increase almost up to the limit with the miniaturization. Because an oxidizing agent is used when ruthenium is subjected to chemical-mechanical polishing (CMP) in order to make a contact, a reaction product with the oxidizing agent may be formed on a surface of the ruthenium layer during the CMP.

Conventionally, there has been known as a removing liquid to be used for removing the ruthenium residue a composition containing orthoperiodic acid and having a pH of 11 or more (Patent Document 1), a composition containing orthoperiodic acid and a quaternary ammonium salt compound or an amine compound (Patent Document 2), and the like. The removing liquid described in Patent Document 1 results in a low etching rate of ruthenium and an insufficient removability for the residue due to its strong alkaline property. The removing liquid described in Patent Document 2 has a low pH, which gives rise to concern about the occurrence of a toxic gas ruthenium tetroxide ($RuO_4$) during cleaning of ruthenium. Furthermore, use of the removing liquids in a wafer cleaning device for mass production of semiconductors has problems from the viewpoint of durability of members and particle control.

Patent Document 1: PCT International Publication No. WO2016/068183

Patent Document 2: Japanese Unexamined Patent Application, Publication No. 2018-121086

SUMMARY OF THE INVENTION

The present invention has been made in view of the above-mentioned art. An object of the present invention is to provide a method for producing a semiconductor element, the method including dry-etching or chemically-mechanically polishing a ruthenium-containing layer located as an uppermost layer of a substrate; and bringing a surface of the substrate into contact with a chemical solution thereby satisfactorily cleaning and removing a ruthenium residue formed on the surface of the substrate; and a chemical solution to be suitably used in the method for producing a semiconductor element.

The present inventors have found that the above-mentioned problems can be solved by cleaning a surface of a substrate on which a ruthenium-containing layer located as an uppermost layer has been subjected to dry-etching or chemical-mechanical polishing with a cleaning liquid containing hydroxylamine or a derivative thereof (A1) and an alkaline compound (B1) which is more basic than the hydroxylamine or a derivative thereof (A1) prior to a cleaning treatment with the above-mentioned ruthenium-removing liquid containing orthoperiodic acid. Thus, the present invention has been completed.

A first aspect of the present invention relates to a method for producing a semiconductor element including:

dry-etching or chemically-mechanically polishing a ruthenium-containing layer located as an uppermost layer of a substrate; and bringing a surface of the substrate into contact with a first chemical solution; and bringing the surface of the substrate which has been brought into contact with the first chemical solution into contact with a second chemical solution, the first chemical solution including hydroxylamine or a derivative thereof (A1) and an alkaline compound (B1) which is more basic than the hydroxylamine or a derivative thereof (A1), and the second chemical solution including orthoperiodic acid (A2) and a basic compound (B2).

A second aspect of the present invention relates to a first chemical solution to be used in the method for producing a semiconductor element according to the first aspect, the first chemical solution including:

hydroxylamine or a derivative thereof (A1) and an alkaline compound (B1) which is more basic than the hydroxylamine or a derivative thereof (A1).

According to the present invention, provided is a method for producing a semiconductor element, the method including dry-etching or chemically-mechanically polishing a ruthenium-containing layer located as an uppermost layer of a substrate; bringing a surface of the substrate into contact with a first chemical solution; and then bringing the surface of the substrate into contact with a second chemical solution thereby cleaning and removing a ruthenium residue formed on the surface of the substrate; and a chemical solution to be suitably used in the method for producing a semiconductor element.

DETAILED DESCRIPTION OF THE INVENTION

Method for Producing Semiconductor Element

A method for producing a semiconductor element includes dry-etching or chemically-mechanically polishing a ruthenium-containing layer located as an uppermost layer of a substrate; bringing a surface of the substrate into contact with a first chemical solution; and bringing the surface of the substrate which has been brought into contact with the first chemical solution into contact with a second chemical solution, the first chemical solution including hydroxylamine or a derivative thereof (A1) and an alkaline compound (B1) which is more basic than the hydroxylamine or a derivative thereof (A1), and the second chemical solution including orthoperiodic acid (A2) and a basic compound (B2).

<Step of Cleaning with First Chemical Solution>
(Object to be Treated)

In a step of cleaning with a first chemical solution, an object to be cleaning-treated is a substrate on which a ruthenium-containing layer located as an uppermost layer has been subjected to dry-etching or chemical-mechanical polishing.

The substrate to be dry-etched or chemically-mechanically polished includes the ruthenium-containing layer as the uppermost layer. A method for forming the ruthenium-containing layer on the substrate is not particularly limited and any known method may be used. Examples thereof include a physical vapor deposition (PVD) method such as sputtering, a chemical vapor deposition (CVD) method, and an atomic layer deposition (ALD) method.

A step of dry-etching or chemically-mechanically polishing the substrate is not particularly limited. Preferred examples thereof include a step of forming a metal wiring pattern on the substrate using ruthenium as a metal wiring material by means of a semi-damascene method and a step of further forming contact wiring in MOL, and a step of forming a buried power rail.

As mentioned above, the object to be treated is a substrate on which a ruthenium-containing layer located as an uppermost layer has been subjected to dry-etching or chemical-mechanical polishing. For the dry-etching, when using, for example, $O_2/Cl_2$ as an etching gas, a Ru oxide, a Ru chloride, an unspecified residue derived from a reaction product of another exposed film and the etching gas, etc. are formed and deposited, or form a layer on the surface of the Ru-containing layer which has been subjected to the etching. Furthermore, for the chemical-mechanical polishing, because particles of a metal oxidizing agent are used, a Ru oxide, an unspecified residue, etc. are formed and deposited, or form a layer on the surface of the ruthenium-containing layer which has been subjected to the CMP. In the method for producing a semiconductor element, the deposit or the layer formed on the object to be treated is to be removed and a surface thereof represents a surface to be treated.

(First Chemical Solution)

The first chemical solution includes hydroxylamine or a derivative thereof (A1) and an alkaline compound (B1) which is more basic than the hydroxylamine or a derivative thereof (A1).

The hydroxylamine or a derivative thereof (A1) may be, for example, hydroxylamine or N,N-dialkylhydroxylamine. These may be used alone or two or more thereof may be used in combination.

The N,N-dialkylhydroxylamine is a compound represented by the general formula $R^1R^2NOH$ wherein $R^1$ and $R^2$ each independently represent alkyl. In the formula, $R^1$ or $R^2$ is preferably, for example, a methyl group, an ethyl group, a propyl group, or a butyl group.

Examples of the N,N-dialkylhydroxylamine include N,N-dimethylhydroxylamine, N,N-diethylhydroxylamine, N,N-dipropylhydroxylamine, and N,N-dibutylhydroxylamine.

The hydroxylamine or a derivative thereof (A1) is preferably contained in an amount of 0.1% by mass or more and 20% by mass or less and more preferably 0.3% by mass or more and 10% by mass or less relative to a total mass of the first chemical solution.

The alkaline compound (B1) is a more basic compound than the hydroxylamine or a derivative thereof (A1). The more basic compound than the component (A1) means it has a property of shifting a pH of an aqueous solution consisting of the component (A1) and water to a more alkaline side.

The alkaline compound (B1) is not particularly limited as long as it has the above-mentioned property. Any of an organic alkaline compound and an inorganic alkaline compound may be used. Suitable examples of the organic alkaline compound include a quaternary ammonium salt such as an organic quaternary ammonium hydroxide; alkanolamine; and other organic amines other than alkanolamine such as a primary amine, a secondary amine, a tertiary amine, and an amidine.

Examples of the organic quaternary ammonium hydroxide include tetramethylammonium hydroxide, bis(2-hydroxyethyl)dimethyl ammonium hydroxide, tetraethylammonium hydroxide, tetrapropylammonium hydroxide, tetrabutylammonium hydroxide, methyltriethylammonium hydroxide, trimethyl(hydroxyethyl) ammonium hydroxide, and triethyl(hydroxyethyl) ammonium hydroxide.

Examples of the alkanolamine include monoethanolamine, diethanolamine, monoisopropanolamine, diisopropanolamine, methylethanolamine, N-methylethanolamine, and aminoethylethanolamine.

Examples of the other organic amines include diazabicycloundecene.

Examples of the inorganic alkaline compound include ammonia and an inorganic compound and a salt thereof including an alkaline metal or an alkaline earth metal. Specific examples of the inorganic compound and the salt thereof including the alkaline metal or the alkaline earth metal include lithium hydroxide, sodium hydroxide, potassium hydroxide, rubidium hydroxide, and cesium hydroxide.

The alkaline compound (B1) is preferably contained in an amount of 0.01% by mass or more and 20% by mass or less and more preferably 0.1% by mass or more and 10% by mass or less relative to a total mass of the first chemical solution.

A pH of the first chemical solution is not particularly limited, but is preferably 10 or more and more preferably 11 or more at 20° C. from the viewpoint of improvement of removability of the ruthenium residue.

(Other components)

The first chemical solution may include other components in addition to the above-mentioned components as long as the effect of the present invention is not impaired. Examples of the other components include water, a surfactant, an alcoholic solvent, an ether solvent, and a sulfoxide solvent.

The first chemical solution preferably includes water as a solvent. The water is preferably purified water such as distilled water, ion-exchanged water, and ultrapure water, and more preferably ultrapure water which is commonly used for producing a semiconductor. A content of the water is not particularly limited, but is preferably 20% by mass or more and more preferably 80% by mass or more relative to a total mass of the first chemical solution. Furthermore, the upper limit thereof is not particularly limited, but is preferably less than 99.95% by mass and more preferably 99.9% by mass or less.

The first chemical solution is obtained by mixing the above-mentioned compounds (A1) and (B1) and optionally other components using a known method.

In the step of cleaning with the first chemical solution, a surface of the object to be treated is brought into contact with the first chemical solution. As used herein, the surface of the object to be treated refers to the surface to be treated of the object to be treated. A method for bringing the surface of the object to be treated into contact with the first chemical solution is not particularly limited and any known method may be used. For example, such a method is exemplified by a spraying method, a dipping method, or a liquid-filling method, but is not limited thereto.

For the spraying method, for example, the first chemical solution is sprayed onto the object to be treated which is being carried or rotated in a predetermined direction thereby bringing a surface to be treated of the object to be treated into contact with the first chemical solution.

For the dipping method, the object to be treated is dipped into the first chemical solution thereby bringing the object to be treated into contact with the first chemical solution.

For the liquid-filling method, the first chemical solution is dropped on the object to be treated thereby bringing the object to be treated into contact with the first chemical solution.

These cleaning treatment methods may be appropriately selected depending on structure or material of the object to be treated. In the case of the spraying method or the liquid-filling method, an amount of an etching liquid supplied to the object to be treated may be an amount so that the surface to be treated of the object to be treated is sufficiently wetted with the etching liquid.

A temperature at which the cleaning treatment is performed is not particularly limited, but is, for example, preferably 23° C. or more and 85° C. or less and more preferably 30° C. or more and 70° C. or less. Furthermore, a period of time for which the cleaning treatment is performed is not particularly limited, but is, for example, preferably 30 seconds or more and 30 minutes or less and more preferably 1 minute or more and 10 minutes or less.

<Step of Cleaning with Second Chemical Solution>
(Second Chemical Solution)

The second chemical solution includes orthoperiodic acid (A2) and a basic compound (B2).

Ruthenium is changed to ruthenium tetroxide ($RuO_4$) by binding to four oxygen atoms. The orthoperiodic acid (A2) ($H_5IO_6$) is an oxidizing agent which releases the oxygen atoms for oxidizing the ruthenium. The orthoperiodic acid (A2) has a high oxidation-reduction potential enough to oxidize the ruthenium. Therefore, the second chemical solution including the orthoperiodic acid (A2) can efficiently oxidize the ruthenium and well dissolve the $RuO_4$ produced by oxidization.

The orthoperiodic acid (A2) is contained in an amount of exemplarily 0.01 to 8% by mass, preferably 0.02 to 7% by mass, and more preferably 0.03 to 5% by mass relative to a total mass of the second chemical solution. When the orthoperiodic acid is contained in an amount falling within the above-mentioned range, an etching grade for ruthenium is further improved.

Any of an organic basic compound and an inorganic basic compound may be used as the basic compound (B2). Suitable examples of the organic basic compound include a quaternary ammonium salt such as organic quaternary ammonium hydroxide; an amine oxide; and a tertiary amine.

Examples of the organic quaternary ammonium hydroxide include tetramethylammonium hydroxide, bis(2-hydroxyethyl)dimethyl ammonium hydroxide, tetraethylammonium hydroxide, tetrapropylammonium hydroxide, tetrabutylammonium hydroxide, methyltriethylammonium hydroxide, trimethyl(hydroxyethyl) ammonium hydroxide, and triethyl(hydroxyethyl) ammonium hydroxide.

Examples of the amine oxide include trimethylamine N-oxide, triethylamine N-oxide, 4-methylmorpholine N-oxide, and pyridine N-oxide.

Examples of the tertiary amine include trimethylamine, triethylamine, tripropylamine, tributylamine, 4-methylmorpholine, and N,N-dimethylaniline.

Examples of the inorganic basic compound include ammonia, and an inorganic compound and a salt thereof including an alkaline metal or an alkaline earth metal. Specific examples of the inorganic compound and the salt thereof including the alkaline metal or the alkaline earth metal include lithium hydroxide, sodium hydroxide, potassium hydroxide, rubidium hydroxide, and cesium hydroxide.

The basic compound (B2) is preferably contained in an amount of 0.002% by mass or more and 10% by mass or less and more preferably 0.005% by mass or more and 5% by mass or less relative to a total mass of the second chemical solution.

A pH of the second chemical solution is not particularly limited, but is preferably 8 or more and 10 or less and more preferably 8.5 or more and 10 or less at 20° C.

(Other components)

The second chemical solution may include other components in addition to the above-mentioned components as long as the effect of the present invention is not impaired. Examples of the other components include water, a surfactant, and tertiary alcohol.

The second chemical solution preferably includes water as a solvent. The water is preferably purified water such as distilled water, ion-exchanged water, and ultrapure water, and more preferably ultrapure water which is commonly used for producing a semiconductor.

A content of the water is not particularly limited, but is preferably 50% by mass or more and more preferably 80% by mass or more relative to a total mass of the second chemical solution. Furthermore, the upper limit thereof is not particularly limited, but is preferably less than 99.95% by mass and more preferably less than 99.9% by mass or less.

The second chemical solution is obtained by mixing the above-mentioned compounds (A2) and (B2) and optionally other components using a known method.

In the step of cleaning with the second chemical solution, a surface of the substrate, the surface having been brought into contact with the first chemical solution, is brought into contact with the second chemical solution. A method for bringing the surface of the substrate into contact with the second chemical solution is not particularly limited and the same method as described for the first chemical solution may be used.

A temperature at which the cleaning treatment is performed is not particularly limited, but is, for example, preferably 15° C. or more and 60° C. or less and more preferably 20° C. or more and 50° C. or less. Furthermore, a period of time for which the cleaning treatment is performed is not particularly limited, but is, for example, preferably 5 seconds or more and 10 minutes or less and more preferably 10 seconds or more and 3 minutes or less.

EXAMPLES

Hereinafter, the present invention will be described in more detail with reference to Examples and Comparative Examples, but the present invention is not limited to Examples below.

Examples 1 to 4 and Comparative Examples 1 to 17

(Preparation of Chemical Solution)

Chemical solutions S1 to S16 were prepared as shown in Table 1 below. Chemical solutions S2 to S16 were aqueous solutions. Furthermore, it is indicated that chemical solutions S10 to S14 and S16 are mixed solutions containing two types of chemical solution components at concentrations shown in Table 1. Furthermore, Table 1 also shows pHs of the chemical solutions.

TABLE 1

| Chemical solution | Type | pH |
|---|---|---|
| S1 | Water | 7.0 |
| S2 | 0.1% by mass of HF | 3.3 |
| S3 | 5% by mass of HCl | <1 |
| S4 | 5% by mass of $NH_3$ | 12.0 |
| S5 | 5% by mass of $NH_2OH$ | 9.8 |
| S6 | 2% by mass of TMAH | 13.2 |
| S7 | 2% by mass of TBAH | 12.6 |
| S8 | 2% by mass of AEEA | 11.5 |
| S9 | 2% by mass of MEA | 11.6 |
| S10 | 5% by mass of $NH_2OH$ + 5% by mass of $NH_3$ | 11.8 |
| S11 | 5% by mass of $NH_2OH$ + 2% by mass of TMAH | 13.0 |
| S12 | 5% by mass of $NH_2OH$ + 2% by mass of TBAH | 12.4 |
| S13 | 5% by mass of $NH_2OH$ + 2% by mass of AEEA | 11.4 |
| S14 | 5% by mass of DEHA + 5% by mass of $NH_3$ | 12.0 |
| S15 | 1% by mass of orthoperiodic acid (pH is adjusted to 8.8 with the addition of $NH_3$) | 8.8 |
| S16 | 5% by mass of $NH_2OH$ + 2% by mass of MEA | 11.5 |

Note that, abbreviations used in Table 1 are as follows:
TMAH: tetramethylammonium hydroxide
TBAH: tetrabutylammonium hydroxide
AEEA: aminoethylethanolamine
MEA: monoethanolamine
DEHA: diethylhydroxylamine (Production of Test Substrate)

A PVD-Ru substrate (thickness of Ru: 50 nm) was formed by sputtering and a surface thereof was dry-etched using an ICP dry-etching device so that the Ru was etched to 3 nm. The thus dry-etched Ru substrate was cut into a rectangle of 1.5×2 cm thereby producing test substrates.

Dry-etching device: NE-550E (from ULVAC)
Type of gas: $O_2/Cl_2$
Flow rate of gas: $O_2/Cl_2$=46 sccm/4 sccm
Etching temperature: 23° C.
Etching time: 15 seconds Cleaning Treatment Test of Comparative Examples 1 to 15

Each of the above-mentioned chemical solutions S1 to S15 was added into a beaker. Each of the test substrates was dipped into each of the chemical solutions and subjected to a cleaning treatment with stirring at 300 rpm at the temperature for the time described in Table 2 below. Note that, Comparative Examples 1 to 15 were subjected to the cleaning treatment using one type of the chemical solution. In Table 2, the types of chemical solutions, the treatment temperatures, and the treatment times used in Comparative Examples 1 to 14 were described in columns under "Cleaning with first chemical solution" and the type of chemical solution, the treatment temperature, and the treatment time used in Comparative Example 15 were described in columns under "Cleaning with second chemical solution".

Cleaning Treatment Test of Examples 1 to 4 and Comparative Examples 16 and 17

Each of the above-mentioned chemical solutions S4 to S5, S10 to S12, and S16 was added into a beaker. Each of the test substrates was dipped into each of the chemical solutions and subjected to a cleaning treatment with the first chemical solution and a water washing treatment with stirring at 300 rpm at the temperature for the time described in Table 2 below. Then, the above-mentioned chemical solution S15 was added into a beaker. Each of the test substrates was dipped into each of the chemical solution S15 and subjected to a cleaning treatment with the second chemical solution with stirring at 300 rpm at the temperature for the time described in Table 2.

(Measurement of Chlorine Removal Rate on Ruthenium Surface)

Each of the substrates which had been subjected to the cleaning treatment test was washed with water and dried with a nitrogen gas stream. A surface of the thus-dried substrate was subjected to X-ray photoelectron spectrometry (XPS analysis) thereby determining a Cl2-derived peak area. The test substrate before the cleaning treatment test was also determined for the Cl2-derived peak area, from which a chlorine removal rate was calculated according to the following expression: Chlorine removal rate (%)=((Peak area before cleaning treatment test—Peak area after cleaning treatment test/Peak area before cleaning treatment test))×100.

A chlorine removability was rated on a scale of A to E based on the chlorine removal rate as described below. The results are shown in Table 2.

A: 75% or more and 100% or less
B: 50% or more and less than 75%
C: 25% or more and less than 50%
D: 10% or more and less than 25%
E: Less than 10%

(Measurement of Ru Etching Amount)

The substrate which had been subjected to the cleaning treatment test was dried and measured for Ru thickness by fluorescent X-ray analysis. The test substrate before the cleaning treatment test was also determined for Ru thickness. A Ru etching amount (Å) was calculated from the Ru thicknesses before and after the cleaning treatment test. The results are shown in Table 2.

TABLE 2

| | Cleaning with first chemical solution | | | Cleaning with second chemical solution | | | Ru | |
| --- | --- | --- | --- | --- | --- | --- | --- | --- |
| | Type | Temperature (° C.) | Time (min) | Type | Temperature (° C.) | Time (min) | Etching amout (Å) | Chlorine removability |
| Comparative Example 1 | S1 | 23 | 2 | — | — | — | <1 | E |
| Comparative Example 2 | S2 | 60 | 2 | — | — | — | <1 | E |
| Comparative Example 3 | S3 | 60 | 2 | — | — | — | <1 | E |
| Comparative Example 4 | S4 | 60 | 2 | — | — | — | <1 | D |
| Comparative Example 5 | S5 | 60 | 2 | — | — | — | <1 | D |
| Comparative Example 6 | S6 | 60 | 2 | — | — | — | <1 | D |
| Comparative Example 7 | S7 | 60 | 2 | — | — | — | <1 | D |
| Comparative Example 8 | S8 | 60 | 2 | — | — | — | <1 | D |
| Comparative Example 9 | S9 | 60 | 2 | — | — | — | <1 | D |
| Comparative Example 10 | S10 | 60 | 2 | — | — | — | <1 | D |
| Comparative Example 11 | S11 | 60 | 2 | — | — | — | <1 | D |
| Comparative Example 12 | S12 | 60 | 2 | — | — | — | <1 | D |
| Comparative Example 13 | S13 | 60 | 2 | — | — | — | <1 | D |
| Comparative Example 14 | S14 | 60 | 2 | — | — | — | <1 | D |
| Comparative Example 15 | — | — | — | S15 | 23 | 1 | 2 | C |
| Comparative Example 16 | S4 | 60 | 2 | S15 | 23 | 1 | 2 | C |
| Comparative Example 17 | S5 | 60 | 2 | S15 | 23 | 1 | 4 | C |
| Example 1 | S10 | 60 | 2 | S15 | 23 | 1 | 13 | A |
| Example 2 | S11 | 60 | 2 | S15 | 23 | 1 | 9 | B |
| Example 3 | S12 | 60 | 2 | S15 | 23 | 1 | 6 | B |
| Example 4 | S16 | 60 | 2 | S15 | 23 | 1 | 7 | B |

For Comparative Examples 1 to 15 which had been subjected to the cleaning treatment with one type of the chemical solution, the chlorine removal rate was less than 50% at a maximum which was for Comparative Example 15. The Ru etching amount was 2 Å at a maximum which was for Comparative Example 15. These results demonstrate that Comparative Examples 1 to 15 had insufficient removability of, for example, an etching residue formed on the Ru surfaces of the test substrates. Furthermore, in Comparative Examples 16 and 17, precleaning treatments with chemical solutions S4 and S5 were performed before the cleaning treatment with chemical solution S15 which was the same chemical solution as one used in Comparative Example 15. However, both had insufficient chlorine removability.

On the other hand, Examples 1 to 4 in which the precleaning treatments were performed with chemical solutions S10 to S12 and S16 instead of chemical solution S4 in Comparative Example 16 increased the chlorine removal rate and the Ru etching amount to at least 50% or more and at least 7 Å, respectively.

These results demonstrate that, when the cleaning treatment with the first chemical solution containing the hydroxylamine (A1) and the alkaline compound (B1) is performed as the precleaning treatment before the cleaning treatment with the second chemical solution containing the orthoperiodic acid (A2) and the basic compound(B2), excellent residue removability is achieved.

What is claimed is:

1. A method of cleaning a substrate, the method comprising:
   dry-etching a ruthenium-containing layer located as an uppermost layer of a substrate using $O_2/Cl_2$;
   subsequently bringing a surface of the substrate into contact with a first chemical solution; and
   bringing the surface of the substrate which has been brought into contact with the first chemical solution into contact with a second chemical solution,
   wherein the first chemical solution comprises hydroxylamine or a derivative thereof (A1) and an alkaline compound (B1) which is more basic than the hydroxylamine or a derivative thereof (A1),
   the second chemical solution comprises orthoperiodic acid (A2) and a basic compound (B2),
   a content of the hydroxylamine or the derivative thereof (A1) is 0.3% by mass or more and 10% by mass or less relative to a total mass of the first chemical solution,
   a content of the alkaline compound (B1) is 0.1% by mass or more and 10% by mass or less relative to a total mass of the first chemical solution,
   a content of the orthoperiodic acid (A2) is 0.03% by mass or more and 5% by mass or less relative to a total mass of the second chemical solution,
   a content of the basic compound (B2) is 0.005% by mass or more and 5% by mass or less relative to a total mass of the second chemical solution,
   wherein in bringing the surface of the substrate into contact with the first chemical solution, a temperature at which the cleaning treatment is performed is 30° C. or more and 70° C. or less, and a period of time for which the cleaning treatment is performed is 1 minute or more and 10 minutes or less,
   wherein in bringing the surface of the substrate into contact with the second chemical solution, a temperature at which the cleaning treatment is performed is 20° C. or more and 50° C. or less, and a period of time for which the cleaning treatment is performed is 10 seconds or more and 3 minutes or less, and
   the ruthenium-containing layer is formed by a physical vapor deposition method.

2. The method of cleaning a substrate according to claim 1, wherein the second chemical solution comprises ammonia as the basic compound (B2).

3. The method of cleaning a substrate according to claim 1, wherein the second chemical solution has a pH of 8 or more and 10 or less.

4. The method of cleaning a substrate according to claim 1, wherein the hydroxylamine or a derivative thereof (A1) is one or more selected from the group consisting of hydroxylamine and N, N-dialkylhydroxylamine.

5. The method of cleaning a substrate according to claim 1, wherein the first chemical solution has a pH of 10 or more.

* * * * *